(12) United States Patent  
Mirgorodski et al.

(10) Patent No.: US 7,919,805 B1  
(45) Date of Patent: Apr. 5, 2011

(54) NON-VOLATILE MEMORY CELL WITH TWO CAPACITORS AND ONE PNP TRANSISTOR AND A METHOD OF FORMING SUCH A CELL IN A 1-POLY SOI TECHNOLOGY

(75) Inventors: Yuri Mirgorodski, Sunnyvale, CA (US); Natalia Lavrovskaya, Sunnyvale, CA (US); Saurabh Desai, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 413 days.

(21) Appl. No.: 11/807,322

(22) Filed: May 25, 2007

(51) Int. Cl.
*H01L 29/76* (2006.01)

(52) U.S. Cl. ............. 257/314; 257/E29.3; 438/201

(58) Field of Classification Search .......... 257/314, 257/E23.9; 438/201
See application file for complete search history.

(56) References Cited

U.S. PATENT DOCUMENTS

| | | | |
|---|---|---|---|
| 5,227,654 A * | 7/1993 | Momose et al. | 257/370 |
| 6,265,752 B1 * | 7/2001 | Liu et al. | 257/487 |
| 6,429,085 B1 * | 8/2002 | Pinter | 438/320 |
| 6,770,951 B2 * | 8/2004 | Huang et al. | 257/557 |
| 2002/0158273 A1 * | 10/2002 | Satoh et al. | 257/211 |
| 2003/0198087 A1 * | 10/2003 | Kinsey et al. | 365/185.18 |
| 2006/0023553 A1 * | 2/2006 | Takeyama et al. | 365/230.03 |

* cited by examiner

*Primary Examiner* — Thao X Le  
*Assistant Examiner* — Matthew Gordon  
(74) *Attorney, Agent, or Firm* — Jurgen K. Vollrath; Vollrath & Associates

(57) ABSTRACT

In a non-volatile memory cell, a single poly SOI technology is used to save space and achieve low current programming by providing two capacitors formed in an n-material over an NBL, forming a inverter in an n-material over a PBL, and isolating the NBL from the PBL by means of a lightly doped region or a deep trench isolation region.

10 Claims, 4 Drawing Sheets

NON-VOLATILE MEMORY CELL WITH TWO CAPACITORS AND ONE PNP TRANSISTOR AND A METHOD OF FORMING SUCH A CELL IN A 1-POLY SOI TECHNOLOGY

FIELD OF THE INVENTION

The invention relates to a non-volatile memory (NVM) cell. In particular it relates to a NVM that makes use of a single polysilicon layer.

BACKGROUND OF THE INVENTION

FIG. 1 shows a prior art electrically erasable PROM (EEPROM) 100. It includes an n+ drain 102 and n+ source 104 formed in a p-well 106 and separated by a channel region 108. A floating gate 150 is formed over the channel region 108 and separated from the substrate 106 by a dielectric 112 in the form of a gate oxide. A control gate 114, which is separated from the floating gate 110 by an insulating layer 116, is formed over the floating gate 110. The floating gate 110 acts as the charge storage region for the memory device and is programmed by applying a voltage to the drain 102 and pulsing the control gate 114. This creates a high conductivity region in the channel region 108. High energy electrons (hot electrons) are accelerated across the channel region 108 and occasionally collide with lattice or dopant atoms to generate additional electron-hole pairs by impact ionization. The resultant scattered electrons occasionally have sufficient energy to bridge the gap of the dielectric 112 to the floating gate 110, being helped across by the voltage on the control gate. While programming of the cells involves hot electrons colliding with lattice and dopant atoms, erasing involves Fowler-Nordheim tunneling. In order to achieve this tunneling effect, a high electric field is established across the gate oxide 112 between the floating gate 110 and the channel 108. The effect is that during erasing of the memory cell, electrons are removed from the floating gate 110 by pulsing the drain 102 while holding the control gate 114 at ground or negative potential. The source 104 is permitted to float during erasing. The EEPROM thus has the advantage of allowing individual memory cells to be erased electronically.

One disadvantage of making use of hot electrons and impact ionization to program the memory cells is that it requires a large current through the channel region.

FIG. 2 shows an electrically erasable PROM (EEPROM) 200, which differs from the EEPROM in FIG. 1 in that it includes a thin tunnel dielectric 202 between the drain 204 and the floating gate 206. This allows both programming and erasing by Fowler-Nordheim tunneling, which is achieved by providing a potential difference across the drain 204 and control gate 208 of the order of 20V. During programming, electrons are added to the floating gate 206 by holding the drain at ground level and pulsing the control gate 208 at 20V for about 10 ms.

In contrast, during erasing of the memory cell, electrons are removed from the floating gate 206 by pulsing the drain 204 while holding the control gate 208 at ground potential. The source 210 is permitted to float during programming and erasing. As mentioned above, the EEPROM has the advantage of allowing individual memory cells to be erased electronically. In fact, in practice all of the memory cells in an array are typically erased and thereafter select memory cells are programmed.

The advantage of the FIG. 2 approach is that it facilitates programming with low current consumption. However like the FIG. 1 approach it requires a double poly process.

Yet another type of memory cell, known as the Frohmann-Bentchkowsky EPROM 300, is shown in FIG. 3 and involves only a single poly layer defining a gate 302 separated from a channel region 304 by a gate oxide layer 306. An insulating layer 310 also covers the gate 302 to completely encapsulate the gate 302, thereby defining a floating gate that acts as the charge accumulation region. A p+ drain 312 and p+ source 314 are formed in an n-well 320 or n-substrate on either side of the channel region 304 and programming of the memory cell occurs by providing a lower voltage to the drain 312 compared to the source 314 and well 320. In particular, the well 320 can be held at ground level with the source 314 at ground level, while the drain 312 is held at a negative voltage. Alternatively the drain 312 can be held at ground while the well 320 is provided with a positive voltage and the source 314 is held at the positive voltage. The effect is a high electric field across the channel region 304 which causes hot electrons to be accelerated across the channel and occasionally to generate electron hole pairs by impact ionization. Some of the electrons generated by the impact ionization bridge the gap to the floating gate 302 to establish a negative charge in the gate. However, during the erasing process, since there is no control gate, there is no way to remove the charge from the floating gate. Thus the only way to erase a memory array made of memory cells of this nature is to eradiate them with UV radiation thereby erasing all of the memory cells in the array. Thus while this structure has the advantage of making use of only a single poly layer, it suffers from the disadvantage that individual memory cells in an array cannot be separately erased and the erasing is not electrical.

In order to address this problem, a single poly EEPROM was developed as shown in FIG. 4. This prior art EEPROM includes a first PMOS involving a p+ drain 400 and a p+ source 402 in a first n-well 404 with a floating poly gate 406 formed above a channel 408 between the drain 400 and source 402. The EEPROM further includes a second PMOS comprising a p+ drain 410 and a p+ source 412 in a second n-well 414, with a floating poly 416 formed over a channel region 418 between the drain 410 and p+ source 412. By including a second capacitor as defined by the second poly 416, spaced from the channel region 418 by an oxide layer 420, the cell of FIG. 4 provides for a control gate that allows the storage capacitor (as defined by the poly 406 spaced from the channel 408 by an oxide layer) to be electrically erased. It will however be appreciated that this structure has the drawback that it requires two PMOS devices. It therefore requires a considerable amount of space as defined by the well spacing between the two PMOS devices.

Thus it will be appreciated that each of the prior art devices suffers from certain disadvantages. In the EPROM cell of FIG. 3 the capacitor is defined by a floating gate separated from a well by a gate oxide, however since there is no control gate, the erasing process requires UV radiation. In contrast, all of the electrically erasable memory cells involve a control transistor and a capacitor for charge storage. For instance, in the EEPROM of FIG. 1 and EEPROM of FIG. 2 the capacitor is formed by the floating gate separated by the gate oxide from the well, and a control gate is used to control the floating gate voltage. These EEPROM devices however also suffer from disadvantages, in that the floating gate and control gate are formed from two separate poly layers. In the case of the EEPROM of FIG. 4 the above problem is addressed in that it makes use of only a single poly. However, it requires two PMOS transistors, each formed in an n-well and therefore uses up a lot of space as determined by the well-to-well spacing, which is typically addressed by forming a p-well between the n-wells.

The present invention seeks to improve the memory cell density of the prior art while maintaining the advantage of a single poly structure.

SUMMARY OF THE INVENTION

According to the invention, there is provided a non-volatile memory cell comprising a first capacitor that includes a first polysilicon region, a second capacitor that includes a second polysilicon region, a first transistor that includes a polysilicon gate, wherein the first polysilicon region, second polysilicon region, and polysilicon gate are connected to each other to define a floating polysilicon region, the cell further comprising selection means for selecting or deselecting the cell during a read operation and during a program operation. The selection means may comprise an NMOS transistor that includes a first gate and a PMOS transistor that includes a second gate, wherein the first and second gates are connected to a common select pin. The first and second capacitors may be formed in an n-material that is positioned on top of an n-buried layer (NBL), while the first transistor, NMOS transistor, and PMOS transistor may be formed in an n-material that is positioned on top of a p-buried layer (PBL). The floating polysilicon region may be formed from a single polysilicon layer. Typically the PBL and NBL are isolated from each other, e.g., by a lightly doped region or a deep trench isolation region, the width of the lightly doped region or deep trench isolation region being chosen to avoid breakdown between the PBL and NBL during program or erase mode. The first capacitor may include an n+ region formed in an n-well, wherein electrons are transferred during erase mode from the floating polysilicon region to the n-well by Fowler-Nordheim tunneling. The NMOS transistor may include an n+ region formed in a p-well, and electrons may be transferred during program mode from the p-well to the floating gate by Fowler-Nordheim tunneling.

Preferably the cell includes only a single PMOS transistor.

Further, according to the invention there is provided a non-volatile memory (NVM) comprising multiple non-volatile memory cells, each non-volatile memory cell including a first capacitor that includes a first polysilicon region, second capacitor that includes a second polysilicon region, a first transistor that includes a polysilicon gate, and a selection means for selecting or deselecting the cell during a read operation and during a program operation, wherein the first polysilicon region, second polysilicon region, and polysilicon gate are connected to each other to define a floating polysilicon region, wherein the first capacitors of the NVM are connected to each other, and the second capacitors of the NVM are connected to each other.

Still further, according to the invention, there is provided a method of forming a NVM cell, comprising forming two capacitors in an n-material over an NBL, forming an inverter in an n-material over a PBL, and isolating the NBL and PBL by means of a lightly doped region or a deep trench isolation region. The width of the lightly doped region or deep trench isolation region may be adjusted to provide a breakdown voltage that exceeds voltages experienced by the NVM during erase and program modes.

DETAILED DESCRIPTION OF THE INVENTION

Figure 1:
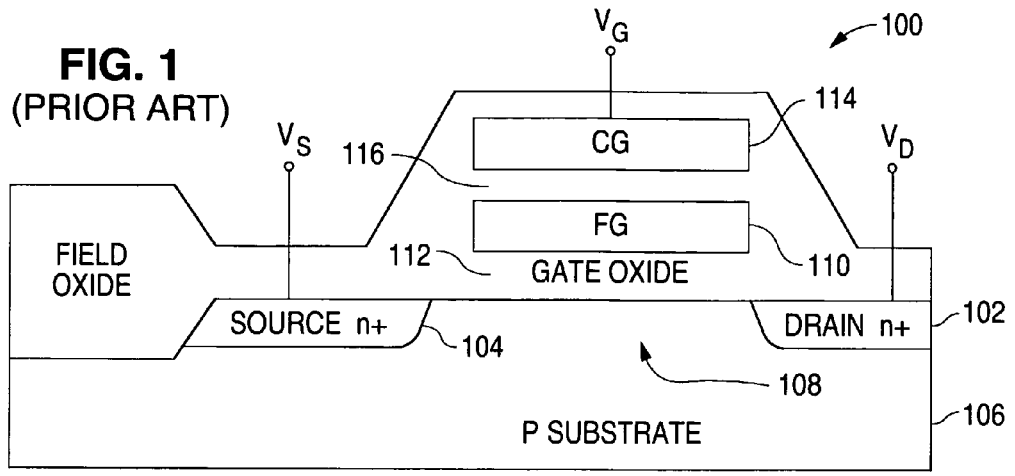
FIG. 1 is a sectional side view of a prior art double poly EEPROM.
Figure 2:
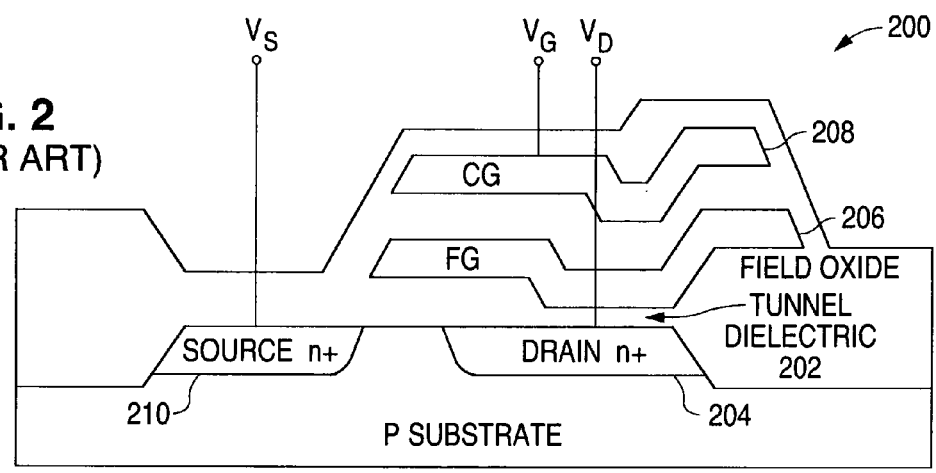
FIG. 2 is a sectional side view of another prior art double poly EEPROM.
Figure 3:
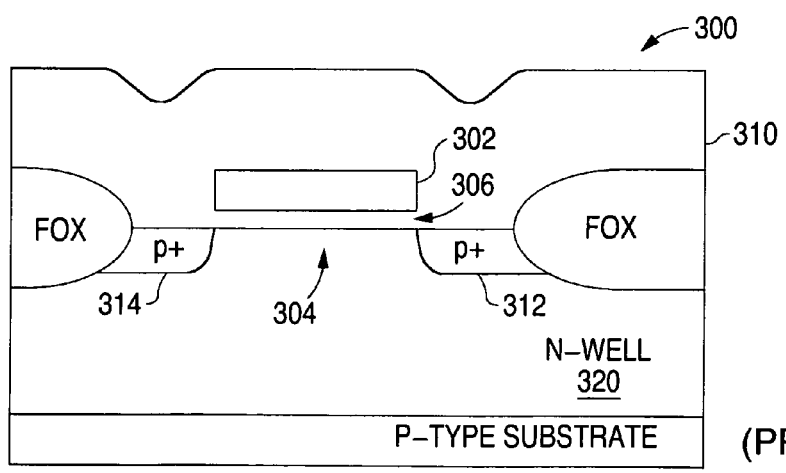
FIG. 3 is a sectional side view of a prior art single poly EPROM memory cell.
Figure 4:
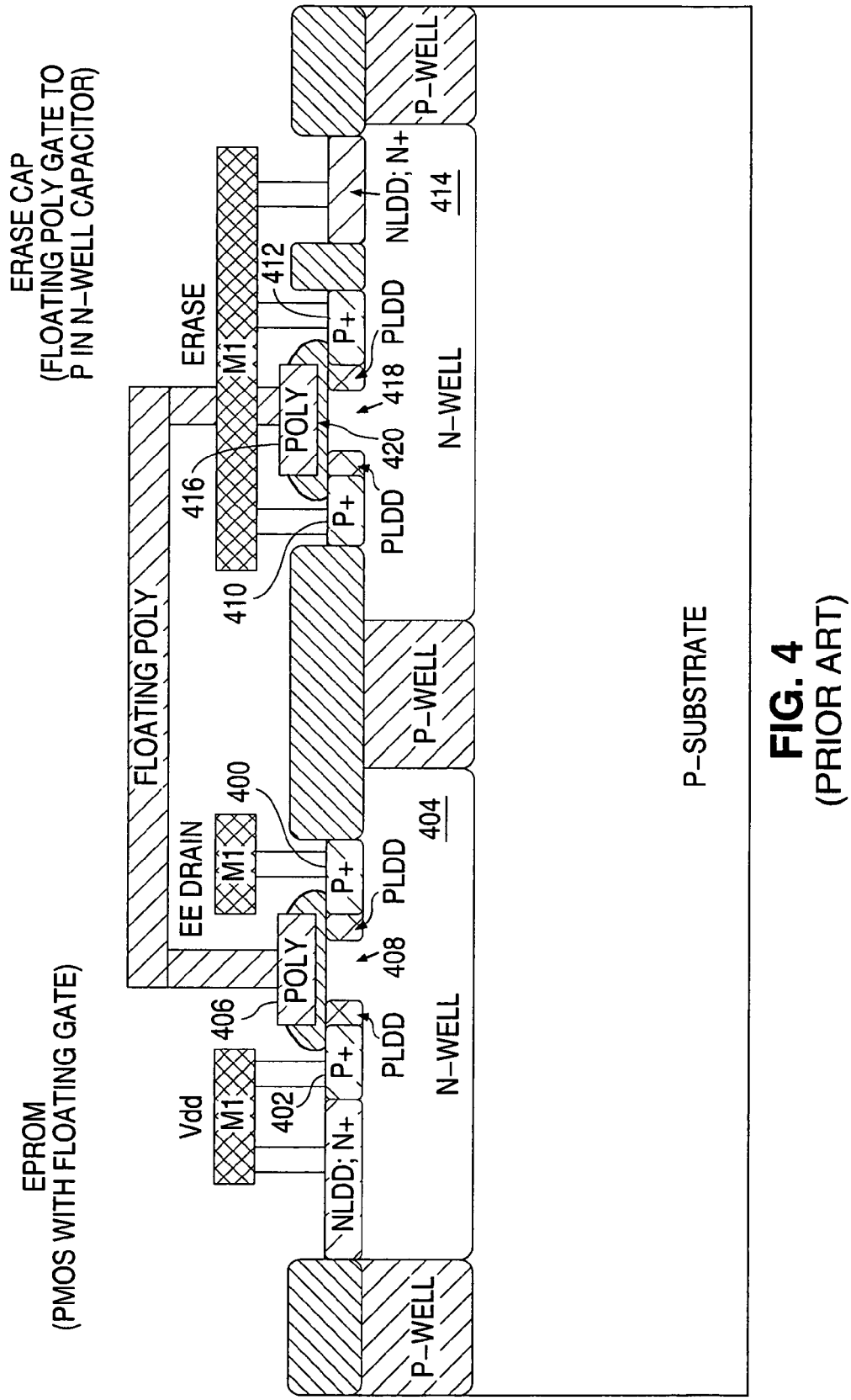
FIG. 4 is a side view of a prior art single poly EEPROM cell.
Figure 5:
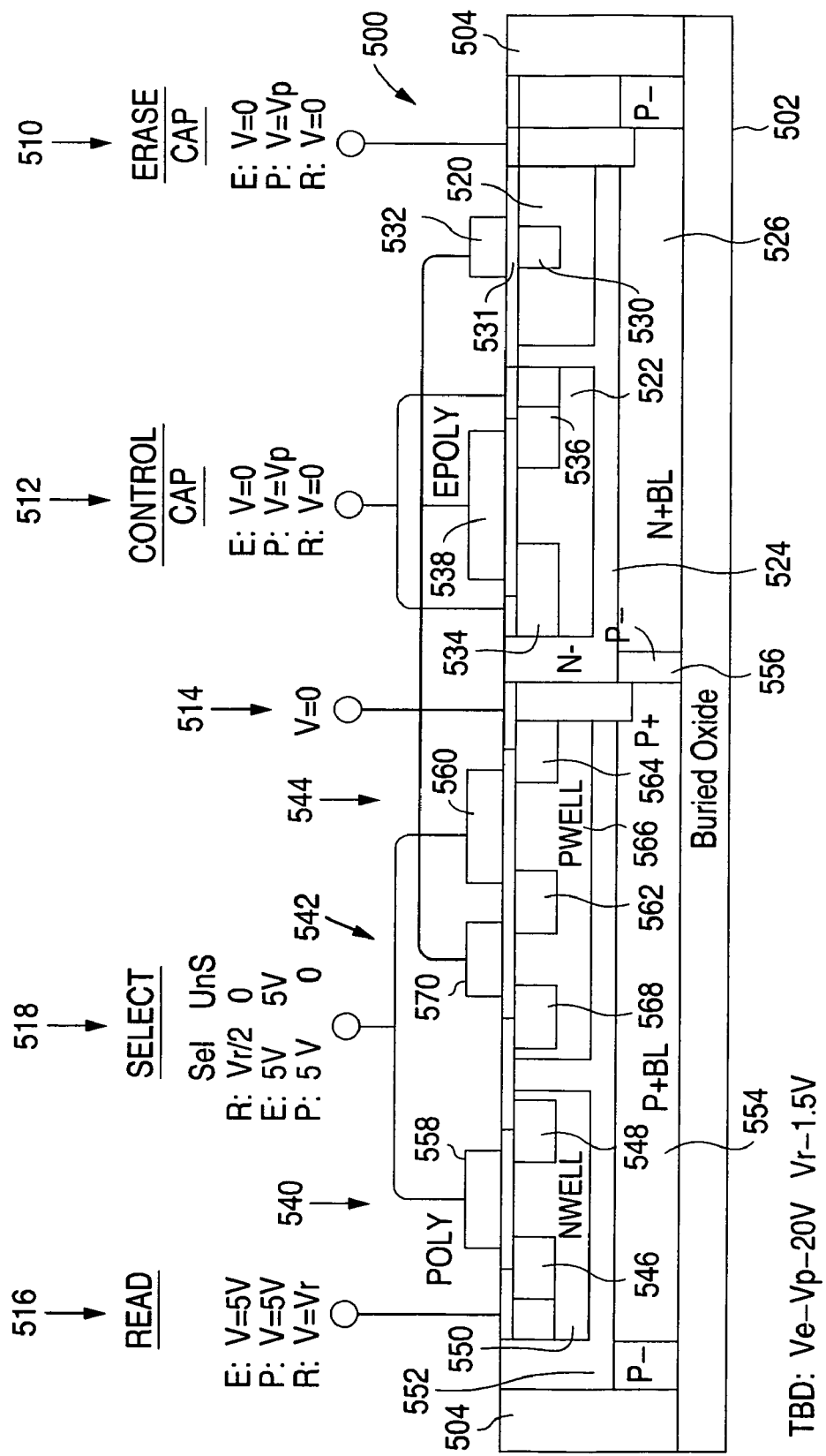
FIG. 5 is sectional view through one embodiment of a NVM cell of the invention.
Figure 6:
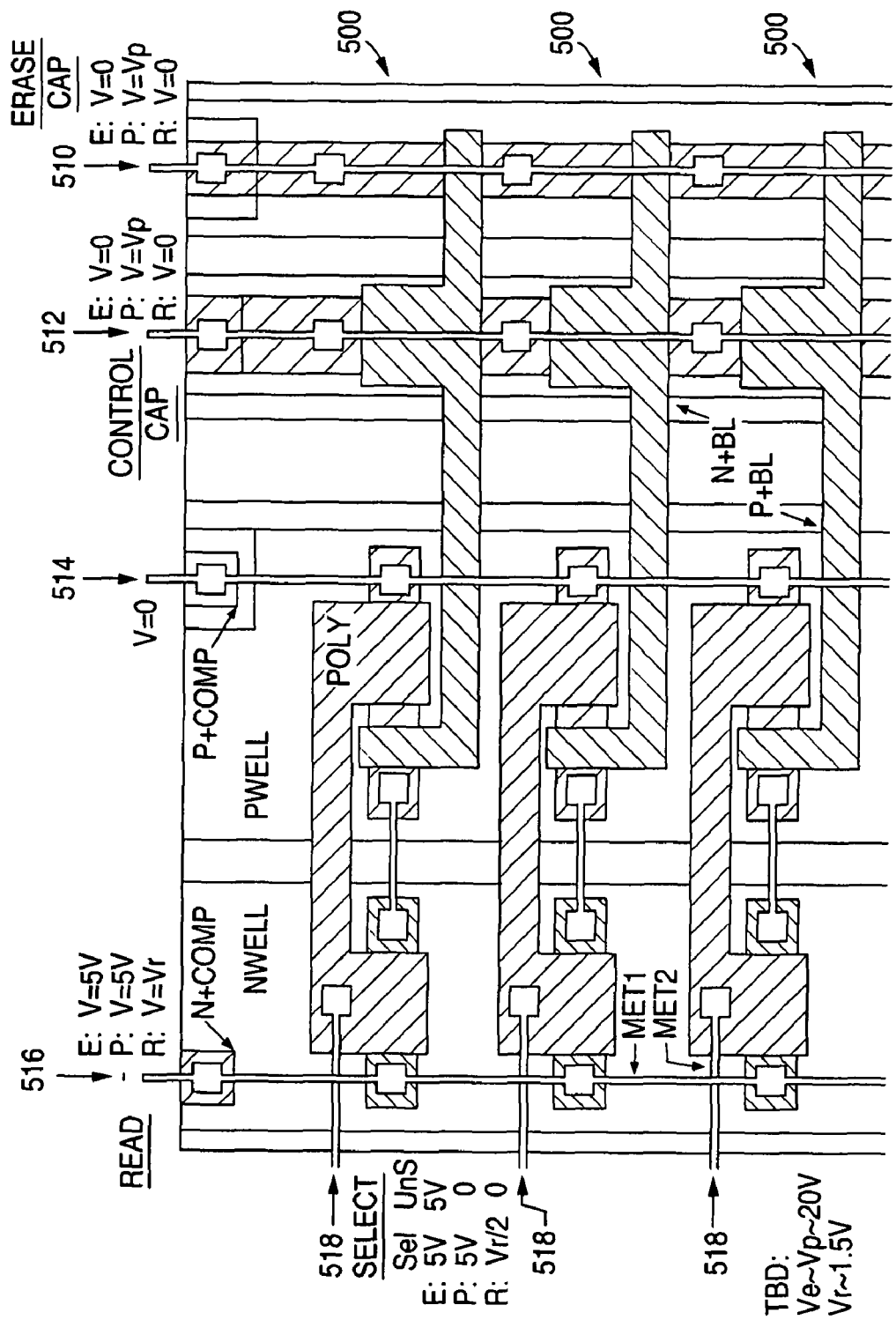
FIG. 6 is a top view of an array of three memory cells of one embodiment of the invention.

One embodiment of the present invention is shown in FIGS. 5 and 6, which show a sectional side view and a plan view, respectively, of one embodiment of a non-volatile memory (NVM) cell in accordance with the invention.

The NVM cell is implemented in Silicon-on-Insulator (SOI) [or Silicon-on-Isolator] single polysilicon technology. Thus the cell 500 is formed on a buried oxide layer 502 between deep trench isolation regions 504 (shown only in FIG. 5). It will be noted that the top view actually shows three memory cells 500. In order to save space, the present invention makes use of a common erase cap pin 510, common control cap pin 512, common ground pin and common read pin 516. Nevertheless individual cells can be selected by virtue of select pins 518. The function of these pins and the operation of the memory cell array will be discussed in greater detail below.

As is clearly shown in FIG. 5, the memory cell 500 includes two capacitors on the right hand side of FIG. 5: an erase capacitor and a control capacitor. The two capacitors are implemented in an n-type material formed on an n-buried layer (NBL). In particular, an n-well 520 and a p-well 522 are formed in the n-type material 524, with the NBL 526 below the n-type substrate material 524. The erase capacitor is defined by an n+ region 530 formed in the n-well 520 and spaced from a polysilicon region 532 by an oxide layer 531. The control capacitor is in turn implemented by forming an NMOS device in the form of n+ drain region 534 and n+ source region 536 formed in the p-well 522, and connecting the drain and source to each other. In fact, the drain 534, source 536 and p-well 522 are commonly connected as shown in FIG. 5.

The left hand side of the cell includes a PMOS transistor 540 and two NMOS devices 542, 544. The PMOS transistor 540 comprises p+ regions 546, 548 formed in an n-well 550 that is in turn formed in n-type substrate material 552, which is typically part of the substrate material 524. The substrate material 552 is however formed on a p-buried layer (PBL) 554, which is separated in this embodiment from the NBL 526 by a lightly doped p-region 556. In accordance with the invention size of the lightly doped p-region 556 can be adjusted to allow high enough breakdown voltage between PBL and NBL. In another embodiment the PBL 554 and NPL 526 are isolated from each other by a deep trench isolation region. Again the width of the deep trench can be adjusted to ensure a high enough breakdown voltage between the PBL and NBL to deal with the high program and erase voltages. The gate 558 of the PMOS transistor 540 is defined by a polysilicon region, which also extends to form the gate 560 of the NMOS transistor 544. Thus the PMOS transistor 540 and NMOS transistor 544 are connected as an inverter to define a selector as is discussed in greater detail below.

The NMOS 544 is defined by the gate 560 and n+ regions 562, 564 formed in a p-well 566. A third n+ region 568 is formed in the p-well 566 and together with the n+ region 562 forms the NMOS 542. The gate 570 of the NMOS 542 comprises a polysilicon material that is formed from the same layer as that for gates 558, 560 but is isolated from gates 558, 560. However, the gate 570, poly region 538, and poly region 532 are all connected to define a floating poly. Typically, as shown in FIG. 6, gate 570, gate 538, and poly region 532 are formed from a common piece of the poly layer. The significance of the interconnection between these various poly regions will become clearer from the discussion of the operation of the memory cell below.

During the erase mode the erase cap pin 510 is held at Ve (a high voltage e.g., 20V), thereby placing a high voltage on one side of the erase capacitor which capacitively couples with the polysilicon side 532. The control capacitor pin 512 is held low (e.g. 0V) during erase mode. The combined effect of the three poly sections (erase capacitor poly 532, control capacitor poly 538 and gate poly 570) is that only part of the voltage placed on the n+ region 530 by the erase capacitor pin 510 appears at each poly section. For example if the relative sizes of the control capacitor poly 538, erase capacitor poly 532, and gate poly 570 are 80%, 10%, and 10%, respectively, then a 20 V erase voltage on n+ region 530 will provide 2V (10% of the erase voltage) on the floating poly. Since n+ region 530 is at 20V, while the floating poly is at only 2V, electrons will flow to the high potential of the n+ region 530 by Fowler-Nordheim (FN) tunneling, thereby leaving the entire interconnected polysilicon material with a reduced number of electrons and slightly positive.

At the same time during erase mode the read pin 516 is held at 5V to control the voltage on the p+ region 546. It will be noted that the other p+ region 548 of the PMOS transistor 540 is left floating and is connected to the n+ region 568 of NMOS transistor 542. The other n+ region 562 of NMOS 542 is also left floating, however the n+ region 564 of NMOS 544 is connected to ground through ground pin 514. Thus the voltage on the various floating regions is dictated by the voltage on the gates of the PMOS 540 and NMOS devices 542, 544. As discussed above, the gate 570 of NMOS 542 is controlled by the erase capacitor. In this case, gate 570 is at 2V during erase mode, thereby turning on NMOS 542 and allowing current to flow between n+ region 562, 568. The select pin 558 is held at 5V during erase mode, thereby also turning on NMOS 544 and causing n+ region 562 to be at the same voltage as the n+ region 564 (namely 0V). Thus n+ region 568 and connected p+ region 548 will also be at 0V. However, since poly gate 518 of the PMOS transistor 540 is at the same voltage as p+ region 546, it remains off, leaving a potential difference of 5 V across the PMOS 540.

During program mode, which involves programming of the memory cells the erase capacitor pin 510 is held at Vp (a high voltage e.g., 20V). Thus the n+ region 530 is at the same voltage as during erase mode. However the control capacitor pin 512 is also held at Vp instead of 0V as was the case during erase mode. The effect is that the n+ regions 534, 536 are held at 20V in this example. Thus the floating poly will be at 16 V+2V=18V due to capacitive coupling of the erase cap and control cap. The effect of this is that there will be no FN tunneling at the erase capacitor due to the small potential difference 20-18=2V over the erase cap. However, at the NMOS 542 things are different. During program mode the voltage on the n+ regions 562, 568 is dictated by whether the select pin 518 is selected (5V on the pin 518) or unselected (0V on the pin 518). If pin 518 is selected the PMOS 540 is turned off since the p+ region 546 is also at 5V during program mode. However the NMOS 544 is turned on thereby causing n+ region 562 to be tied low (the same as n+ region 564). Since gate 570 is at 18V NMOS 542 is also turned on causing n+ region 568 to also be tied low and therefore tying p+ region 548 low. Since n+ regions 562, 568 are at 0V while the gate is at 18V, electrons will pass from the p-well 566 to the floating poly by FN tunneling, leaving the floating poly slightly negative.

When the cell is unselected (0V on the select pin 518) the PMOS 540 will be turned on and the NMOS 544 will be turned off. The effect is that the 5 V on the p+ region 546 is passed through to the p+ region 548 and to the n+ region 568. This leaves the p-well 566 at 5V and the floating poly at 18 V, the potential difference of 13V being insufficient for FN tunneling to occur. Thus when unselected there will be no tunneling and no residual positive charge on the floating poly.

During read mode the erase capacitor pin 510 and control capacitor pin 512 are both held at 0V. Thus there is no voltage transferred to the floating poly due to the capacitive coupling. However, the read pin is held at Vr, which in this embodiment is 1.5 V. The select pin 518 is held either at 0V when unselected or at Vr/2 when selected for reading. Thus, when selected PMOS 540 turns on and NMOS 544 turns on. If the cell was previously erased the gate 570 would have a residual positive charge, thereby turning on NMOS 542 as well and allowing current to flow from read pin 516 to ground pin 514. On the other hand if the cell was previously programmed, NMOS 542 would remain turned off and no current would flow. If a cell is not selected for reading (select pin is held at 0V) NMOS 544 would be turned off and there would be no current flow irrespective of whether the cell was previously programmed or not.

Thus the present invention provides an elegant way of implementing a non-volatile memory (NVM) using only a single polysilicon layer and making use of FN tunneling for both erasing and programming, thereby avoiding high current consumption. It also saves space by doing away with isolating p-wells between n-wells, as is the case in prior art 4T structures. It will be appreciated that the isolation provided by the lightly doped region (in this case lightly doped p-region 516) or by a deep trench (in another embodiment) simply has to be sufficient to avoid breakdown under program and erase voltages (20V in our example). Thus the present invention also provides for adjusting the width of the lightly doped region 516 or deep trench to ensure that there is no breakdown during program and erase voltages. The present invention also provides for sharing erase and control capacitors between the memory cells in the array, as is shown in FIG. 6, thereby further saving space. As is evident from the described embodiment, the present invention lends itself for implementation in SOI technology.

What is claimed is:

1. A non-volatile memory cell comprising a first capacitor that includes a first polysilicon region spaced from an n+ region, a second capacitor that includes a second polysilicon region spaced from an n+ region, a first NMOS transistor that includes a polysilicon gate, wherein the first polysilicon region, second polysilicon region, and polysilicon gate are connected to each other to define a floating polysilicon region, and a selection means wherein the selection means comprises an NMOS transistor that includes a first gate and a PMOS transistor that includes a second gate, wherein the first and second gates are connected to a common select pin.

2. A non-volatile cell of claim 1, wherein the first and second capacitors are formed in an n-material that is positioned on top of an n-buried layer (NBL).

3. A non-volatile cell of claim 2, wherein the first transistor, NMOS transistor, and PMOS transistor are formed in an n-material that is positioned on top of a p-buried layer (PBL).

4. A non-volatile cell of claim 1, wherein the floating polysilicon region is formed from a single polysilicon layer.

5. A non-volatile cell of claim 3, wherein the PBL and NBL are isolated from each other.

6. A non-volatile cell of claim 5, wherein the PBL and NBL are isolated by a lightly doped region or a deep trench isolation region, the width of the lightly doped region or deep trench isolation region being chosen to avoid breakdown between the PBL and NBL during program or erase mode.

7. A non-volatile cell of claim 1, wherein the first capacitor includes an n+ region formed in an n-well, and electrons are transferred during erase mode from the floating polysilicon region to the n-well by Fowler-Nordheim tunneling.

8. A non-volatile cell of claim 1, wherein the NMOS transistor includes n+ regions formed in a p-well, and electrons are transferred during program mode from the p-well to the floating gate by Fowler-Nordheim tunneling.

9. A non-volatile cell of claim 1, wherein the cell includes only a single PMOS transistor.

10. A non-volatile memory (NVM) comprising multiple non-volatile memory cells, each non-volatile memory cell including a first capacitor that includes a first polysilicon region spaced from an n+ region, a second capacitor that includes a second polysilicon region spaced from an n+ region, a first NMOS transistor that includes a polysilicon gate, and a selection means for selecting or deselecting the cell during a read operation and during a program operation, wherein the first polysilicon region, second polysilicon region, and polysilicon gate are connected to each other to define a floating polysilicon region, wherein the first capacitors of the NVM are connected to each other, and the second capacitors of the NVM are connected to each other, and a selection means wherein the selection means comprises an NMOS transistor that includes a first gate and a PMOS transistor that includes a second gate, wherein the first and second gates are connected to a common select pin.

* * * * *